(12) United States Patent
Sasaki et al.

(10) Patent No.: US 8,324,707 B2
(45) Date of Patent: Dec. 4, 2012

(54) POWER AMPLIFIER

(75) Inventors: Tadahiro Sasaki, Tokyo (JP); Kazuhide Abe, Kanagawa-ken (JP); Atsuko Iida, Kanagawa-ken (JP); Kazuhiko Itaya, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 16 days.

(21) Appl. No.: 13/050,545

(22) Filed: Mar. 17, 2011

(65) Prior Publication Data

US 2012/0061768 A1    Mar. 15, 2012

(30) Foreign Application Priority Data

Sep. 13, 2010  (JP) .................................. 2010-204797

(51) Int. Cl.
   *H01L 27/105*  (2006.01)
(52) U.S. Cl. ................... 257/504; 257/544; 257/E27.06
(58) Field of Classification Search .................. 257/504, 257/544, E27.06
   See application file for complete search history.

(56) References Cited

U.S. PATENT DOCUMENTS

| | | | |
|---|---|---|---|
| 5,852,315 A | | 12/1998 | Ker et al. |
| 5,852,318 A | * | 12/1998 | Chikamatsu et al. ......... 257/390 |
| 6,140,687 A | * | 10/2000 | Shimomura et al. .......... 257/401 |
| 7,015,544 B2 | * | 3/2006 | Lotfi et al. .................... 257/336 |
| 2005/0045909 A1 | * | 3/2005 | Zhang .......................... 257/173 |
| 2008/0099857 A1 | | 5/2008 | Furuta et al. |
| 2009/0284306 A1 | * | 11/2009 | Chen ............................. 327/535 |
| 2012/0061768 A1 | * | 3/2012 | Sasaki et al. .................. 257/371 |

FOREIGN PATENT DOCUMENTS

WO  WO 03/075353   9/2003

OTHER PUBLICATIONS

Notification of Reasons for Refusal dated on Sep. 4, 2012, in Japanese Patent Application No. 2010-204797 filed Sep. 13, 2010 (with English Translation).

* cited by examiner

*Primary Examiner* — George Fourson, III
(74) *Attorney, Agent, or Firm* — Oblon, Spivak, McClelland, Maier & Neustadt, L.L.P.

(57) ABSTRACT

According to an embodiment, a power amplifier is provided with at least one first growth ring gate structure and multiple second growth ring gate structures. The first growth ring gate structure is bounded by a semiconductor layer and performs a power amplification operation. The multiple second growth ring gate structures are bounded by the semiconductor layer and are arranged adjacently around the first growth ring gate structure in a surrounding manner. When the first growth ring gate structure performs a power amplification operation, the multiple second growth ring gate structures are depleted by applying a reverse bias to the multiple second growth ring gate structures whereby the depleted multiple second growth ring gate structures isolate the first growth ring gate structure from a surrounding portion.

12 Claims, 15 Drawing Sheets

(a)

POWER AMPLIFIER

CROSS REFERENCE TO RELATED APPLICATION

This application is based upon and claims the benefit of priority from the prior Japanese Patent Application No. 2010-204797, filed on Sep. 13, 2010, the entire contents of which are incorporated herein by reference.

FIELD

Embodiments to be described herein relate to a power amplifier.

BACKGROUND

Along with advancement of semiconductor elements in terms of miniaturization, lower voltage operation, and higher integration, numerous types of system LSI and SoC (system on a chip) including a digital and an analog units based on CMOS (complementary metal oxide semiconductor) have been developed in recent years. A power amplifier is a key element in an analog unit based on the CMOS. As the MOS power amplifier, a power amplifier of a multi-finger gate structure, a power amplifier of a waffle gate structure using rectangular gates, and the like have heretofore been proposed.

However, the multi-finger gate structure has a problem that the size cannot be reduced due to an increase in the chip area. In the meantime, the multi-finger gate structure and the waffle gate structure have a problem that an influence of hot carriers generated in the structures cannot be suppressed.

BRIEF DESCRIPTION OF THE DRAWINGS

FIG. 3 is a cross-sectional view taken along an A-A line in FIG. 2a;

FIG. 13 is a cross-sectional view taken along a C-C line in FIG. 12a;

DETAILED DESCRIPTION

Figure 1:
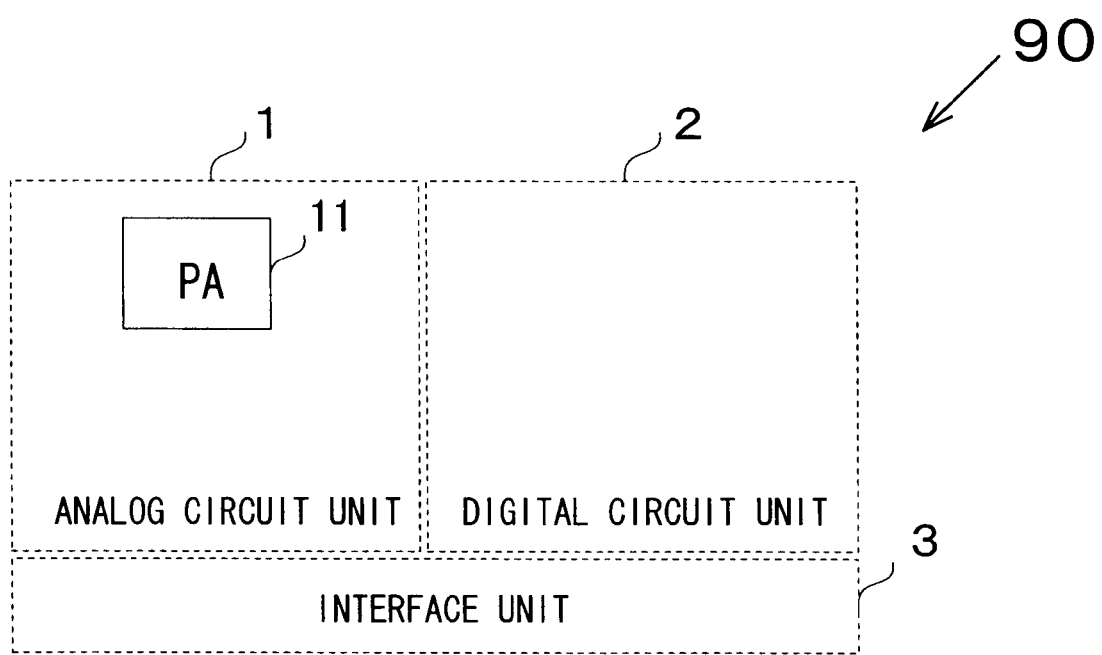
FIG. 1 is a block diagram showing a semiconductor integrated circuit according to a first embodiment of the invention.

According to an embodiment, a power amplifier includes at least one first structure and a plurality of second structures. The first structure is bounded by a semiconductor layer of a first conductivity type and includes a first body contact of the first conductivity type, a first drain, a first gate, a first source, and a first deep well of a second conductivity type, arranged in a polygonal shape having n corners (n is an integer equal to or greater than 3) or in an annular shape in such a manner that the first body contact is located on the inner side and the first deep well is located on the outer side. The first drain, the first gate and the first source are located between the first body contact and the first deep well. The multiple second structures are bounded by the semiconductor layer and are arranged adjacently around the first structure in a surrounding manner. The multiple second structures include a second body contact of the first conductivity type, a second drain, a second gate, a second source, and a second deep well of the second conductivity type, respectively. The multiple second structures are arranged in the polygonal shape having n corners or in the annular shape in such a manner that the second body contact is located on the inner side and the second deep well is located on the outer side. When the first structure performs a power amplification operation, multiple second structures are depleted by applying a reverse bias to the multiple second structures whereby the multiple depleted second structures isolate the first structure from a surrounding portion.

Now, more embodiments will be described below with reference to the accompanying drawings. In the drawings, the same reference numerals indicate the same or similar portions.

Figure 2A:
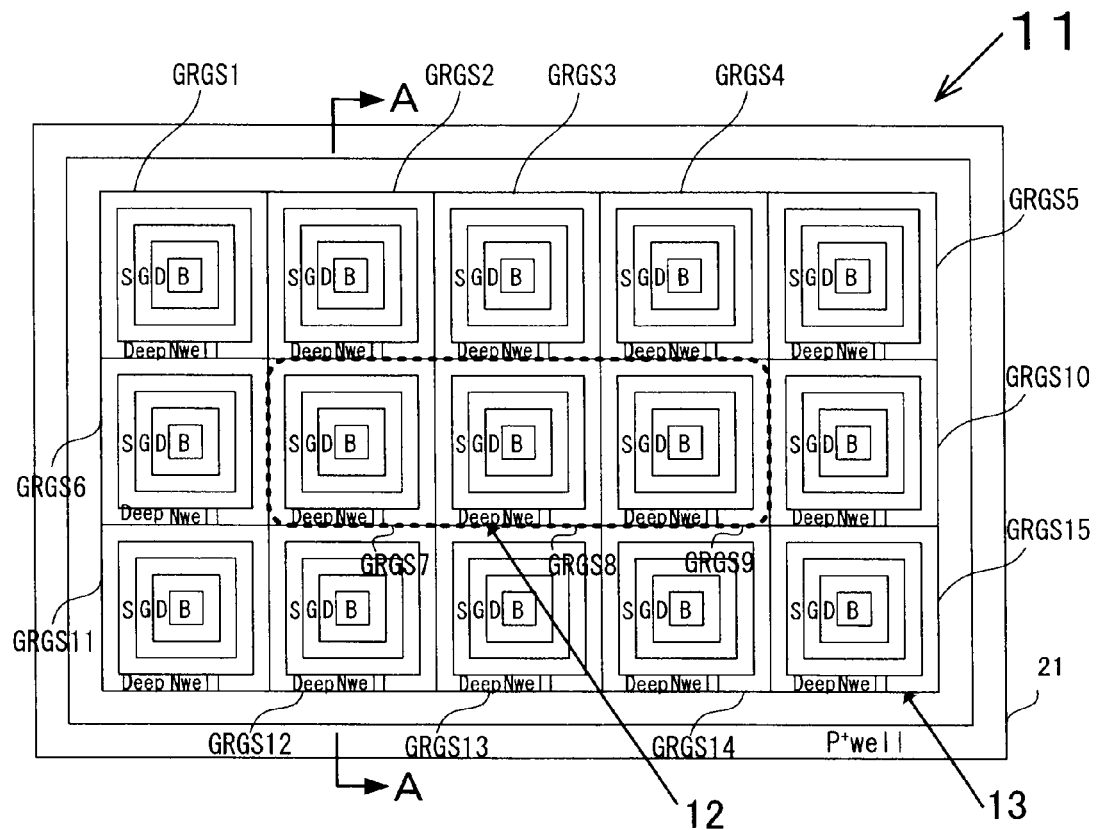
FIGS. 2a and 2b are plan views showing a power amplifier according to the first embodiment.
Figure 2B:
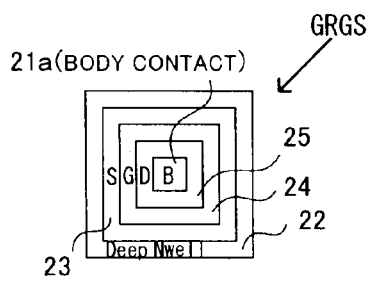
Figure 3:
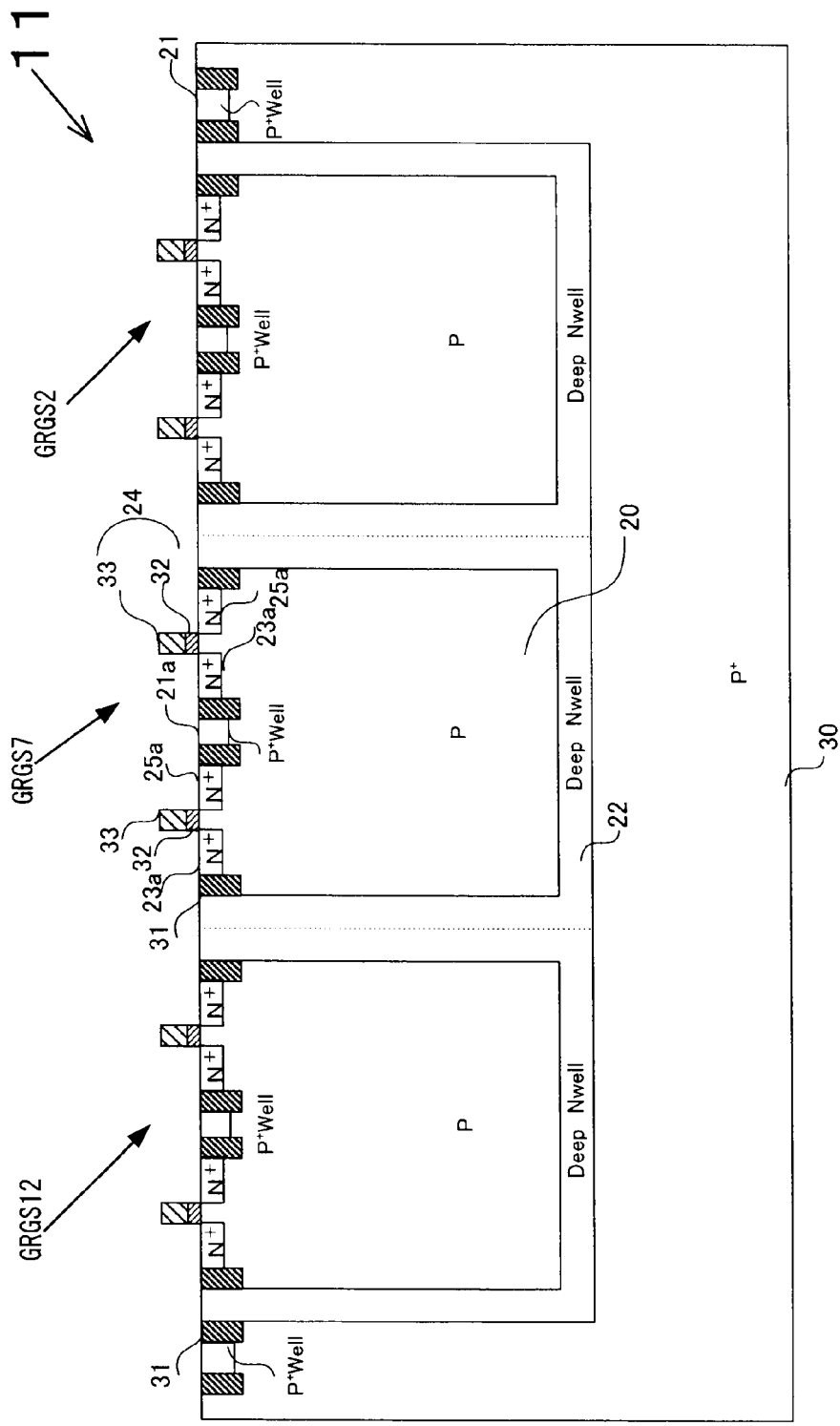

A power amplifier according to a first embodiment will be described with reference the accompanying drawings. FIG. 1 is a block diagram showing a semiconductor integrated circuit. FIG. 2a is a plan view showing a power amplifier and FIG. 2b is a plan view showing a growth ring gate structure. FIG. 3 is a cross-sectional view taken along an A-A line in FIG. 2a. In the embodiment, the power amplifier includes first growth ring gate structures configured to perform a power amplification operation and second growth ring gate structures arranged adjacently around the first growth ring gate structures in a surrounding manner and constitute a depletion region when the first growth ring gate structures are operated.

As shown in FIG. 1, a semiconductor integrated circuit 90 is provided with an analog circuit unit 1, a digital circuit unit 2, and an interface unit 3. The semiconductor integrated circuit 90 is one-chip SoC (system on a chip) in which the analog circuit unit 1, the digital circuit unit 2, and the interface unit 3 are formed by using a CMOS (complementary metal oxide semiconductor) technique. The CMOS technique includes CMOS digital processes and circuitry techniques and allows a transistor to perform on-off operations at relatively low voltages. The analog circuit unit 1 is provided with a power amplifier 11.

As shown in FIG. 2a, the power amplifier 11 is formed by use of the CMOS technique and is provided with growth ring gate structures GRGS1 to GRGS15 each having an N-channel MOSFET structure.

A $P^+$ well 21 is formed and arranged in belt-like fashion spaced apart from and around the growth ring gate structures GRGS1 to GRGS15. The growth ring gate structures GRGS1 to GRGS15 are used as output stage transistors (output stage N-channel MOSFETs) of the power amplifier 11, for example.

Here, illustration and explanation of constituent parts of the power amplifier 11 other than the output stage such as transistors, a matching circuit, wirings, terminals, contacts, via holes will be omitted.

The growth ring gate structures GRGS7 to GRGS9 (first structures) are arranged in parallel in a horizontal direction at a central portion in the drawing. The growth ring gate structures GRGS7 to GRGS9 collectively function as an active portion 12 and perform the power amplification operation.

The growth ring gate structures GRGS1 to GRGS6 and GRGS10 to GRGS15 (second structures) are arranged adjacent around the growth ring gate structures GRGS7 to GRGS9 in a surrounding manner. The growth ring gate structures GRGS1 to GRGS6 and GRGS10 to GRGS15 collectively function as an isolation portion 13. When the growth ring gate structures GRGS7 to GRGS9 perform the power amplification operation, the growth ring gate structures GRGS1 to GRGS6 and GRGS10 to GRGS15 are depleted to constitute a depletion region, thereby isolating the growth ring gate structures GRGS7 to GRGS9 from surrounding portions (the analog circuit unit 1 excluding the power amplifier 11, the digital circuit unit 2, and the interface unit 3). Details of the isolation will be described later.

As shown in FIG. 2b, the growth ring gate structures GRGS1 to GRGS15 are each formed of the growth ring gate structure GRGS and have the same square shape.

The growth ring gate structure GRGS includes a $P^+$ well 21a (a body contact), a drain 25, a gate 24, a source 23, and a deep N-well 22, in such a manner that the $P^+$ well 21a (the body contact) is located on the inner side and the deep N-well 22 is located on the outer side.

To be more precise, the $P^+$ well 21a (the body contact) having a square shape is disposed at a central portion. The drain 25 is adjacently disposed outside the $P^+$ well 21a (the body contact) in belt-like fashion. The gate 24 is adjacently disposed outside the drain 25 in belt-like fashion. The source 23 is adjacently disposed outside the gate 24 in belt-like fashion. The deep N-well 22 is adjacently disposed outside the source 23 in belt-like fashion.

As shown in FIG. 3, the growth ring gate structures GRGS1 to GRGS15 are bounded by a $P^+$ layer 30 (a first semiconductor layer). The $P^+$ well 21 is adjacently disposed around the growth ring gate structures GRGS1 to GRGS15. Shallow trench isolations (STI) 31 are provided on both sides of the $P^+$ well 21.

The deep N well 22 is provided on side surfaces and a bottom surface of each of the growth ring gate structures GRGS (the growth ring gate structures GRGS2, GRGS7, and GRGS12 are representatively shown herein), whereby the growth ring gate structure GRGS is isolated from the $P^+$ layer 30. A P-type body 20 is provided on the deep N-well 22. The shallow trench isolations (STI) 31, an $N^+$ layer 23a serving as the source, an $N^+$ layer 25a serving as the drain, and the $P^+$ well 21a (the body contact) are provided on a surface portion of the body 20.

In each of the growth ring gate structures GRGS2, GRGS7, and GRGS12, the shallow trench isolation (STI) 31 is provided between the deep N-well 22 and the $N^+$ layer 23a. The gate 24 including a gate insulating film 32 and a gate electrode 33 is provided on the body 20 between the $N^+$ layer 23a and the $N^+$ layer 25a so as to overlap with the $N^+$ layer 23a and the $N^+$ layer 25a. The shallow trench isolation (STI) 31 is provided between the $N^+$ layer 25a and the $P^+$ well 21a (the body contact).

Figure 4A:
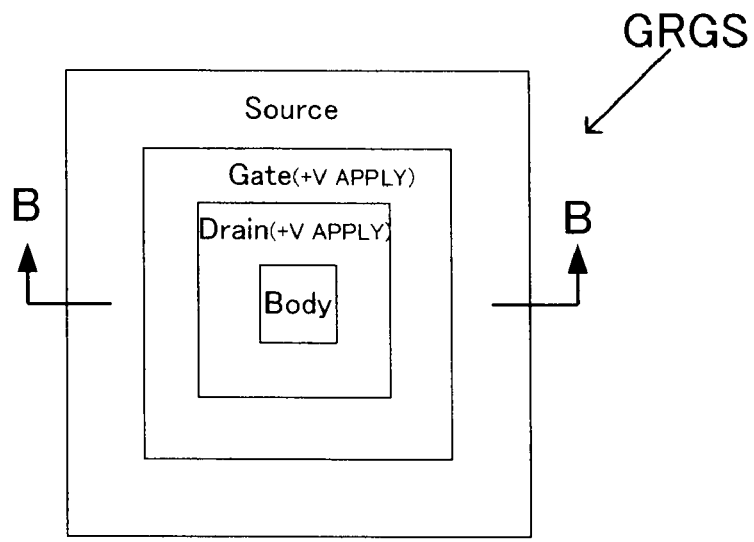
FIGS. 4a and 4b are views showing electric field intensity of a growth ring gate structure according to the first embodiment.
Figure 4B:
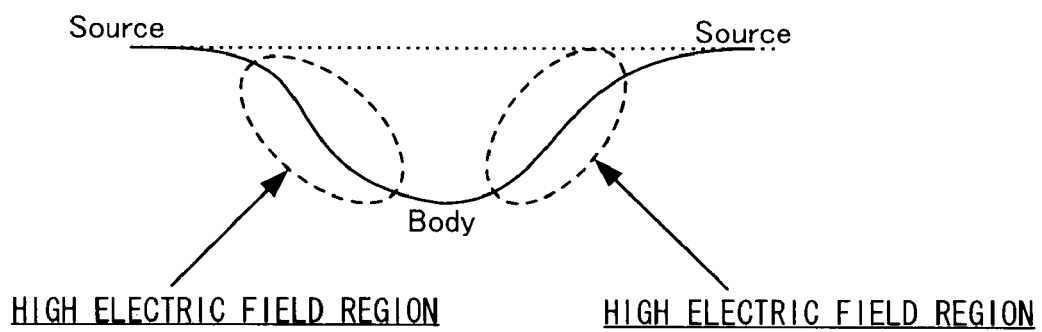

Next, electric field intensity of the growth ring gate structure will be described with reference to FIG. 4a and FIG. 4b. FIG. 4a is a plan view showing a voltage application condition of the growth ring gate structure. FIG. 4b is a view showing the electric field intensity along a B-B line in FIG. 4a.

As shown in FIG. 4a, when a positive (+) voltage is applied to the drain and the gate of the growth ring gate structure GRGS, a space between the source and the body becomes a high electric field region whereby it is possible to impart an electric field gradient toward the central portion (the body) of the growth ring gate structure GRGS. That is, it is possible to suppress spreading of hot carriers toward the surrounding portions of the growth ring gate structure GRGS.

By adopting the growth ring gate structure GRGS, it is possible to suppress a parasitic transistor effect attributable to the hot carriers generated inside the power amplifier 11 and thereby to operate the power amplifier 11 stably.

It is to be noted that it is difficult to suppress an influence of hot carriers in the case of a MOS power amplifier employing the multi-finger gate structure or the waffle gate structure.

Figure 5:
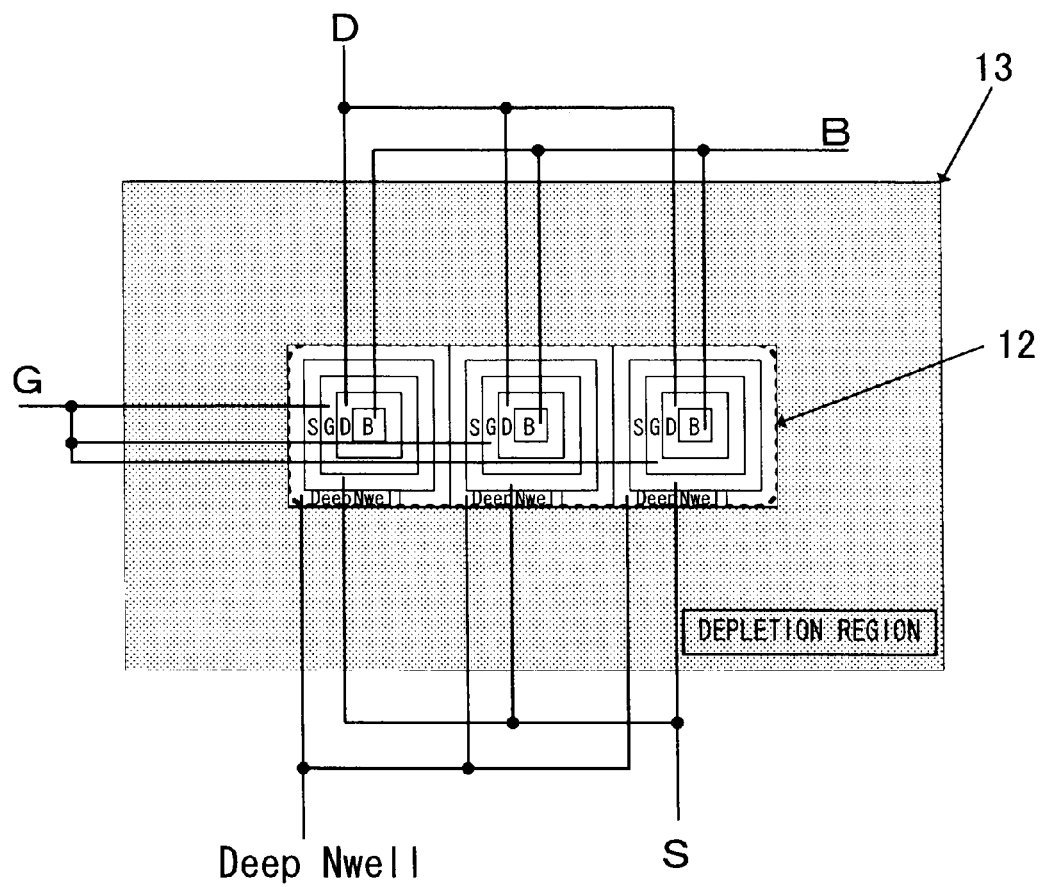
FIG. 5 is view showing an operation of the power amplifier according to the first embodiment.

Next, operations of the power amplifier will be described with reference to FIGS. 5 to 8. FIG. 5 is a view to explain an operation of the power amplifier.

As shown in FIG. 5, when operating the power amplifier 11, the growth ring gate structures GRGS7 to GRGS9 (the active portion 12) are operated as the output stage N-channel MOSFETs at the output stage by bundling the body contacts (B), the drains (D), the gates (G), the sources (S), and the deep N wells of the growth ring gate structures GRGS7 to GRGS9.

When operating the power amplifier 11, the depletion region is formed by depleting the growth ring gate structures GRGS1 to GRGS6 and GRGS10 to GRGS15 (the isolation portion 13). By use of this depletion region, the growth ring gate structures GRGS7 to GRGS9 (the active portion 12) are isolated from the analog circuit unit 1 excluding the power amplifier 11, the digital circuit unit 2, the interface unit 3, and the like.

In this way, it is possible to operate the growth ring gate structures GRGS7 to GRGS9 (the active portion 12) as the output stage N-channel MOSFETs and to feed a large current at the same time.

Figure 6A:
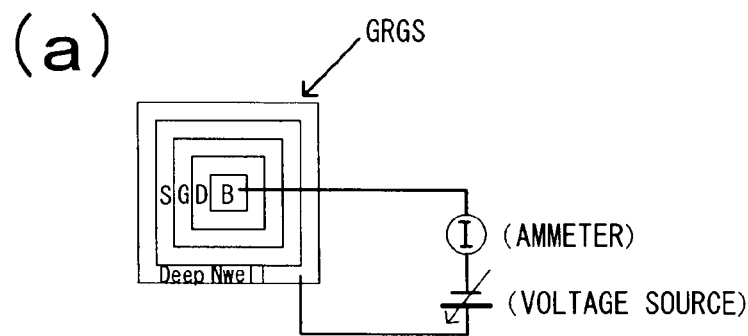
FIGS. 6a and 6b are views showing characteristic features of the growth ring gate structure according to the first embodiment.
Figure 6B:
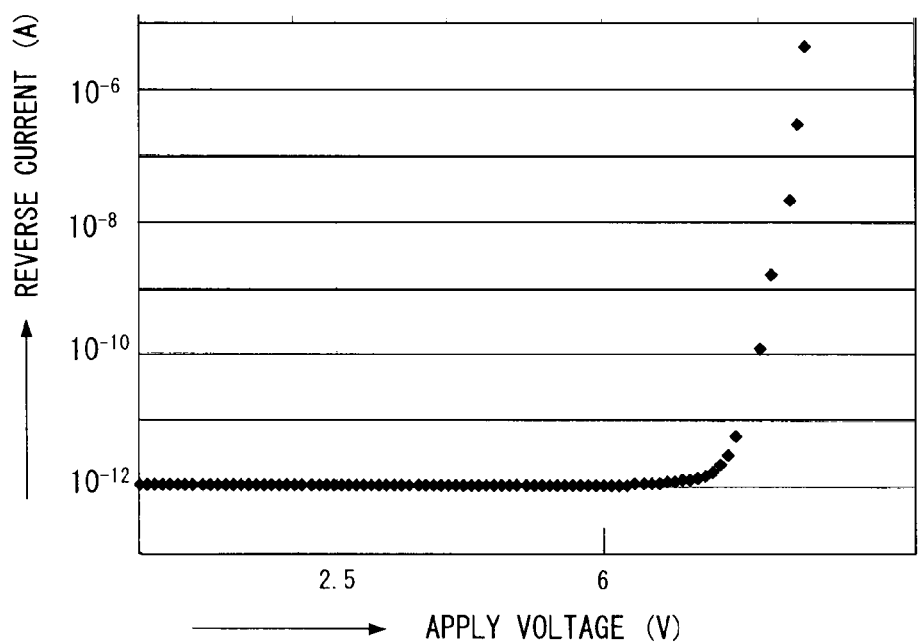

Characteristic features of the gross ring gate structures GRGS1 to GRGS6 and GRGS10 to GRGS15 to be depleted will now be described. FIG. 6a is a view to explain characteristic evaluation of the growth ring gate structure. FIG. 6b is a view showing the characteristic features of the growth ring gate structure.

As shown in FIG. 6a, a positive (+) voltage is applied between the deep N-well and the body contact (B) of the growth ring gate structure GRGS and a current flowing therebetween is observed.

As shown in FIG. 6b, a reverse current remains at an extremely small level around $10^{-12}$ A when an applied voltage (a reverse applied voltage for a diode) between the deep N-well and the body contact (B) is below 7.5 V. The reverse current is increased by raising the applied voltage further, and a breakdown occurs at about 9 V. For example, when the applied voltage is set to 2.5 V, it is apparent that a depletion layer is formed in the diode made of the deep N well and the body and the reverse current is very small at that point (isolation effect is high).

Figure 7:
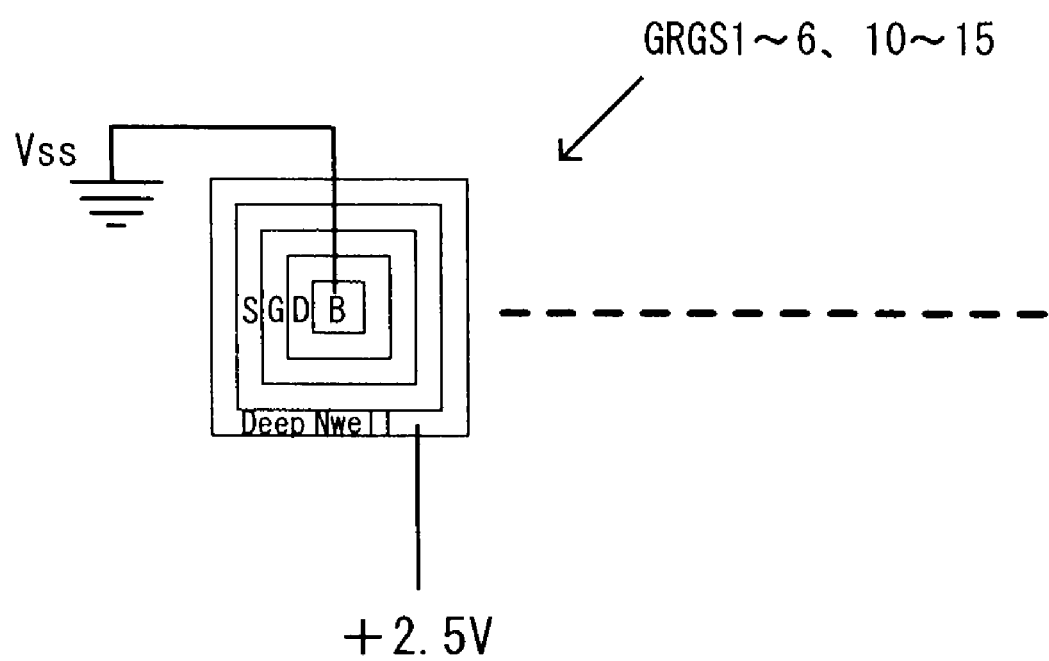
FIG. 7 is a view showing a voltage application condition to deplete an isolation portion according the first embodiment.
Figure 8:
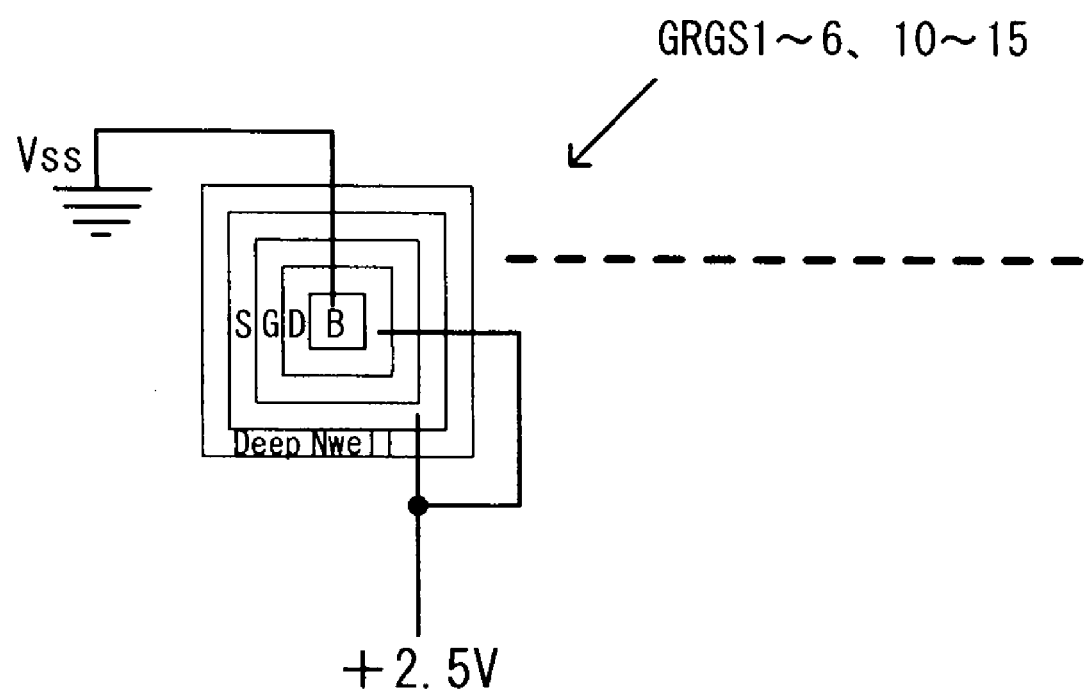
FIG. 8 is a view showing a voltage application condition to deplete an isolation portion according the first embodiment.

A voltage application condition of the gross ring gate structures GRGS1 to GRGS6 and GRGS10 to GRGS15 to be depleted will now be described. FIG. 7 is a view showing a voltage application condition of the gross ring gate structures GRGS1 to GRGS6 and GRGS10 to GRGS15. FIG. 8 is a view showing another voltage application condition of the gross ring gate structures GRGS1 to GRGS6 and GRGS10 to GRGS15.

As shown in FIG. 7, the body contacts (B) of the growth ring gate structures GRGS1 to GRGS6 and GRGS10 to GRGS15 are set to a lower voltage source (ground potential) Vss and a positive (+) voltage of 2.5 V is applied to the deep N wells of the growth ring gate structures GRGS1 to GRGS6 and GRGS10 to GRGS15. By this setting, it is possible to convert the growth ring gate structures GRGS1 to GRGS6 and GRGS10 to GRGS15 into the depletion region.

As shown in FIG. 8, the body contacts (B) of the growth ring gate structures GRGS1 to GRGS6 and GRGS10 to GRGS15 are set to a lower voltage source (ground potential) Vss and a positive (+) voltage of 2.5 V is applied to the drains (D) and the sources (S) of the growth ring gate structures GRGS1 to GRGS6 and GRGS10 to GRGS15. By this setting, it is possible to convert the growth ring gate structures GRGS1 to GRGS6 and GRGS10 to GRGS15 into the depletion region.

With the growth ring gate structures GRGS1 to GRGS6 and GRGS10 to GRGS15 serving as the depletion region, it is not necessary to form metal lines in the surrounding area. Moreover, it is possible to drastically reduce a layout area of the power amplifier 11 because it is not necessary to increase the width of the deep N well 22 which functions as the isolation.

As described above, the power amplifier of the embodiment includes the growth ring gate structures GRGS7 to GRGS9 that have the N-channel MOSFET structure and perform the power amplification operation, and the growth ring gate structures GRGS1 to GRGS6 and GRGS10 to GRGS15 that have the N-channel MOSFET structure, are adjacently arranged around the growth ring gate structures GRGS7 to GRGS9 in a surrounding manner, and constitute the depletion region at the time of power amplification.

Accordingly, it is possible to drastically suppress variation in an RF substrate current attributable to AC hot carriers generated in the power amplifier 11 by use of the depleted growth ring gate structures GRGS1 to GRGS6 and GRGS10 to GRGS15. As a consequence, the power amplifier 11 can be stably operated. Meanwhile, it is possible to drastically suppress an RF substrate leakage current to the analog circuit unit 1 excluding the power amplifier 11, the digital circuit unit 2, the interface unit 3, and the like, and thereby to operate the analog circuit unit 1 excluding the power amplifier 11, the digital circuit unit 2, and the interface unit 3 stably. Furthermore, since it is not necessary to provide the metal wirings or wide deep N-well layers to deal with the AC hot carriers, it is possible to reduce the chip size of the semiconductor integrated circuit 90.

Although each of the growth ring gate structures GRGS1 to GRGS15 is formed into the square shape in the embodiment, the invention is not limited only to this configuration. It is also possible to form each growth ring gate structure into a rectangle or any other polygonal shapes having n corners (n is an integer equal to or above 3) instead of the square.

Figure 9:
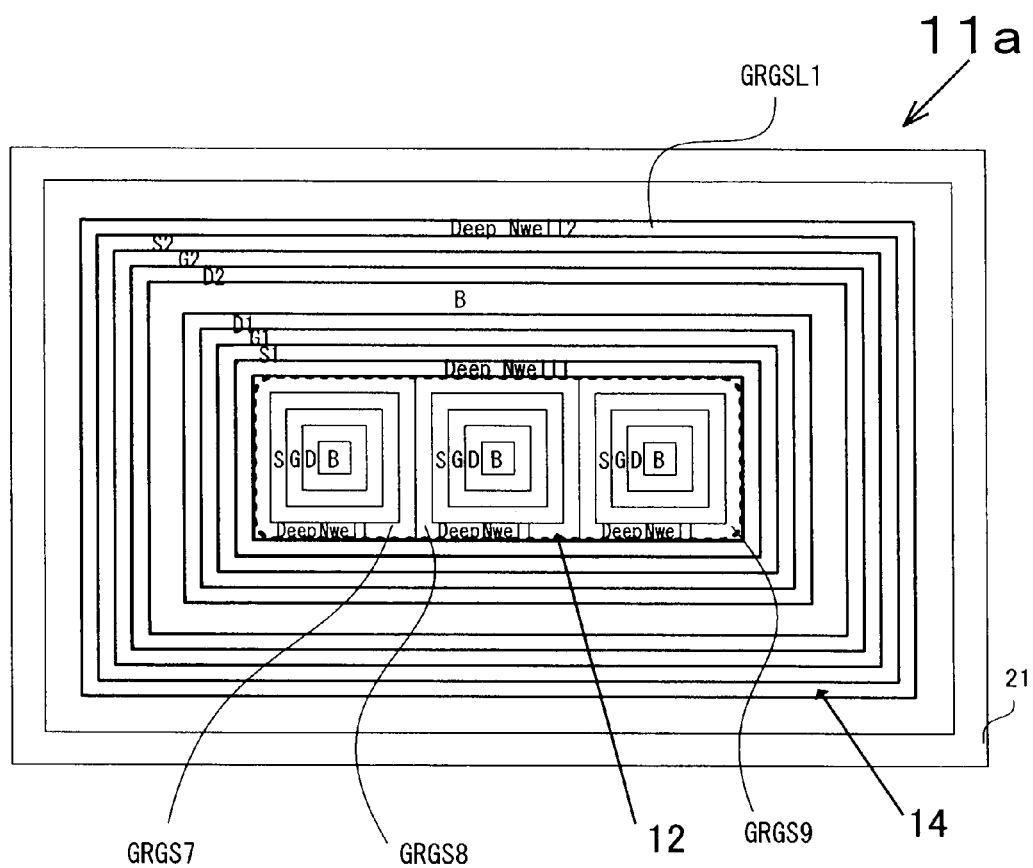
FIG. 9 is a plan view showing a power amplifier according to a second embodiment.

A power amplifier according to a second embodiment will now be described with reference to the accompanying drawings. FIG. 9 is a plan view showing the power amplifier. The configuration of the second growth ring gate structures is modified in the embodiment.

Now, the same constituent portions as those in the first embodiment will be designated by the same reference numerals and the relevant explanation will be omitted. Instead, different features from the first embodiment will only be described below.

As shown in FIG. 9, a power amplifier 11a includes the growth ring gate structures GRGS7 to GRGS9 and a growth ring gate structure GRGSL1, each of which is formed by use of the CMOS technique and has the MOSFET structure. The power amplifier 11a is mounted on one-chip SoC including an analog circuit unit, a digital circuit unit, and an interface unit, which are formed by use of the CMOS technique.

A P$^+$ well 21 is formed in belt-like fashion and arranged space apart from and around the growth ring gate structures GRGS7 to GRGS9 and the growth ring gate structure GRGSL1. The growth ring gate structures GRGS7 to GRGS9 and the growth ring gate structure GRGSL1 are used as output stage transistors (output stage N-channel MOSFETs) of the power amplifier 11a, for example.

Here, illustration and explanation of constituent parts of the power amplifier 11a other than the output stage such as transistors, a matching circuit, wirings, terminals, contacts, via holes will be omitted.

The growth ring gate structure GRGSL1 (the second structure) is adjacently arranged around the growth ring gate structures GRGS7 to GRGS9 in a surrounding manner. The growth ring gate structure GRGSL1 functions as an isolation portion 14. When the growth ring gate structures GRGS7 to GRGS9 perform the power amplification operation, the growth ring gate structure GRGSL1 is depleted to constitute a depletion region, thereby isolating the growth ring gate structures GRGS7 to GRGS9 from surrounding portions.

The growth ring gate structure GRGSL1 has a doughnut-like shape with right-angle corners. To be more precise, a first deep N-well (Deep N-well 1) is adjacently disposed so as to contact the growth ring gate structures GRGS7 to GRGS9. A first source (S1) is adjacently disposed outside the first deep N-well (Deep N-well 1). A first gate (G1) is adjacently disposed outside the first source (S1). A first drain (D1) is adjacently disposed outside the first gate (G1). A body contact (B) is adjacently disposed outside the first drain (D1).

A second drain (D2) is adjacently disposed outside the body contact (B). A second gate (G2) is disposed outside the second drain (D2). A second source (S2) is adjacently disposed outside the second gate (G2). A second deep N-well (Deep N-well 2) is adjacently disposed outside the second source (S2).

Figure 10:
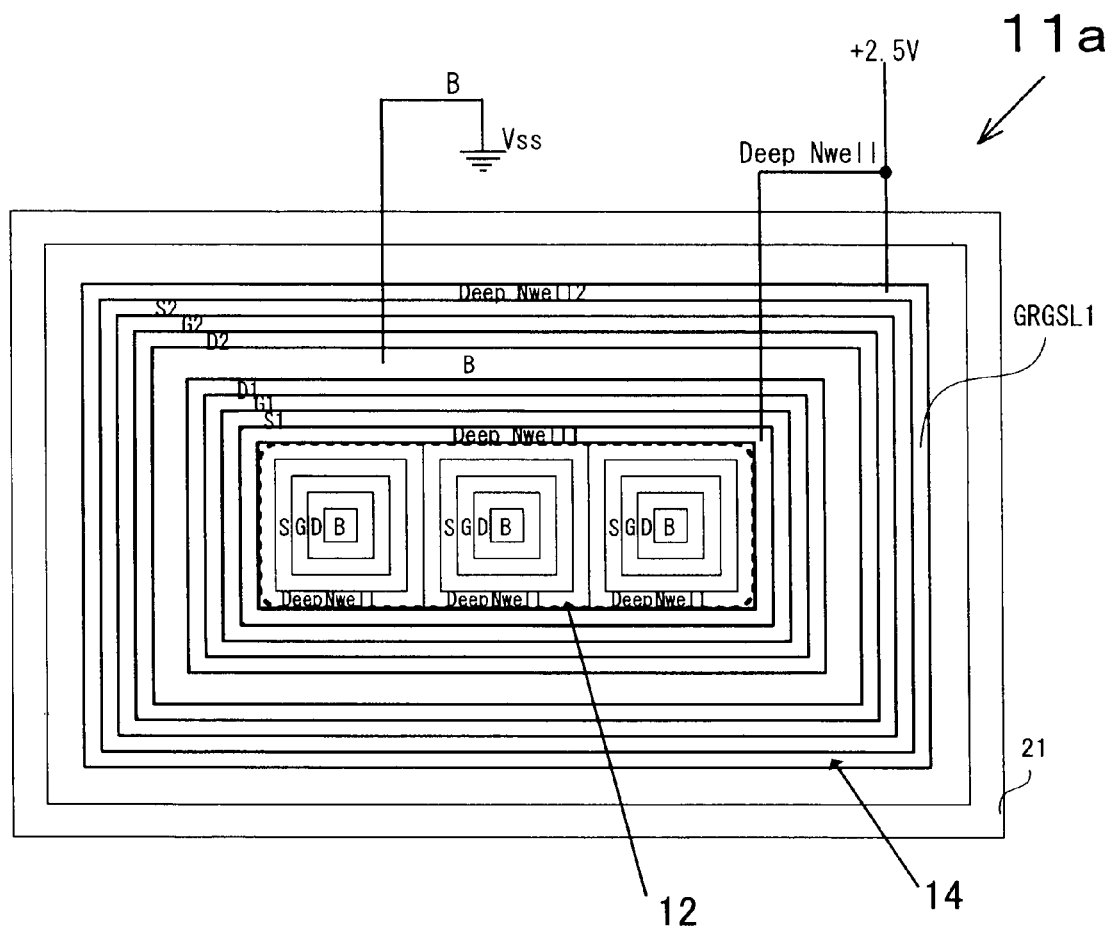
FIG. 10 is a view showing a voltage application condition to deplete an isolation portion according to the second embodiment.

Next, operations of the power amplifier will be described with reference to FIG. 10. FIG. 10 is a view showing a voltage application condition of the growth ring gate structure GRGSL1.

As shown in FIG. 10, the body contact (B) of the growth ring gate structure GRGSL1 is set to a lower voltage source (ground potential) Vss and a positive (+) voltage of 2.5 V is applied to the first deep N-well (Deep N-well 1) and the second deep N-well (Deep N-well 2). By this setting, a depletion region is formed by depleting the growth ring gate structure GRGSL1.

In the embodiment, the number of growth ring gate structure subjected to depletion is one in contrast to the twelve in the first embodiment. Accordingly, it is possible to drastically reduce the numbers of the contacts, via holes, wirings and the like.

As described above, the power amplifier of the embodiment includes the growth ring gate structures GRGS7 to GRGS9 that have the N-channel MOSFET structure and perform the power amplification operation, and the growth ring gate structure GRGSL1 that have the N-channel MOSFET structure, is adjacently arranged so as to surround the growth ring gate structures GRGS7 to GRGS9, and constitute the depletion region at the time of power amplification.

Accordingly, in addition to similar effects to the first embodiment, it is possible to reduce the number of contacts, via holes, wirings, and the like because the number of the growth ring gate structures subjected to depletion is substantially reduced. Therefore, it is possible to simplify the structure of the power amplifier 11a and to reduce the chip size of the semiconductor integrated circuit on which the power amplifier 11a is mounted.

Figure 11:
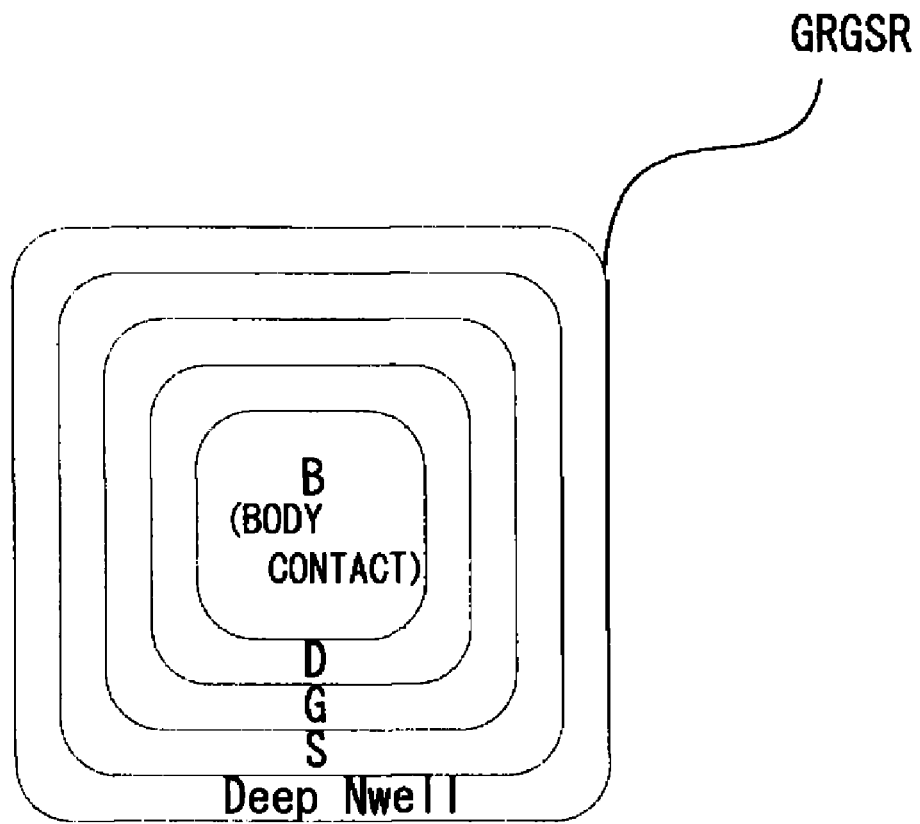
FIG. 11 is a view showing a modification of the growth ring gate structure.

Although each of the growth ring gate structures GRGS7 to GRGS9 is formed into the square shape and the growth ring gate structure GRGSL1 is arranged and formed into the doughnut-like shape in the embodiment, the invention is not limited only to this configuration. For example, it is possible to employ a growth ring gate structure GRGSR of an annular shape provided with four rounded corners as shown in FIG. 11. Alternatively, it is also possible to employ other annular shapes such as a circular shape or an oval shape.

Figure 12A:
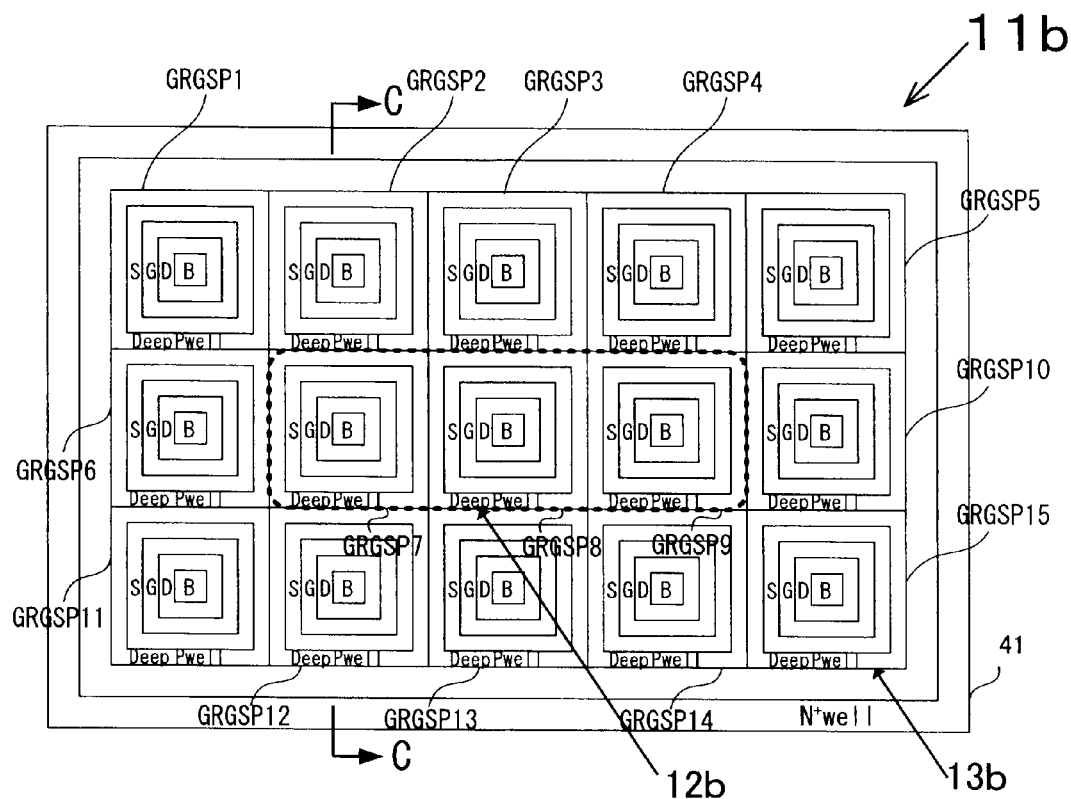
FIGS. 12a and 12b are plan views showing a power amplifier according to a third embodiment.
Figure 12B:
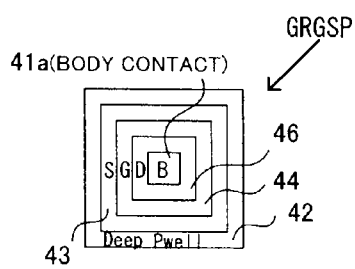
Figure 13:
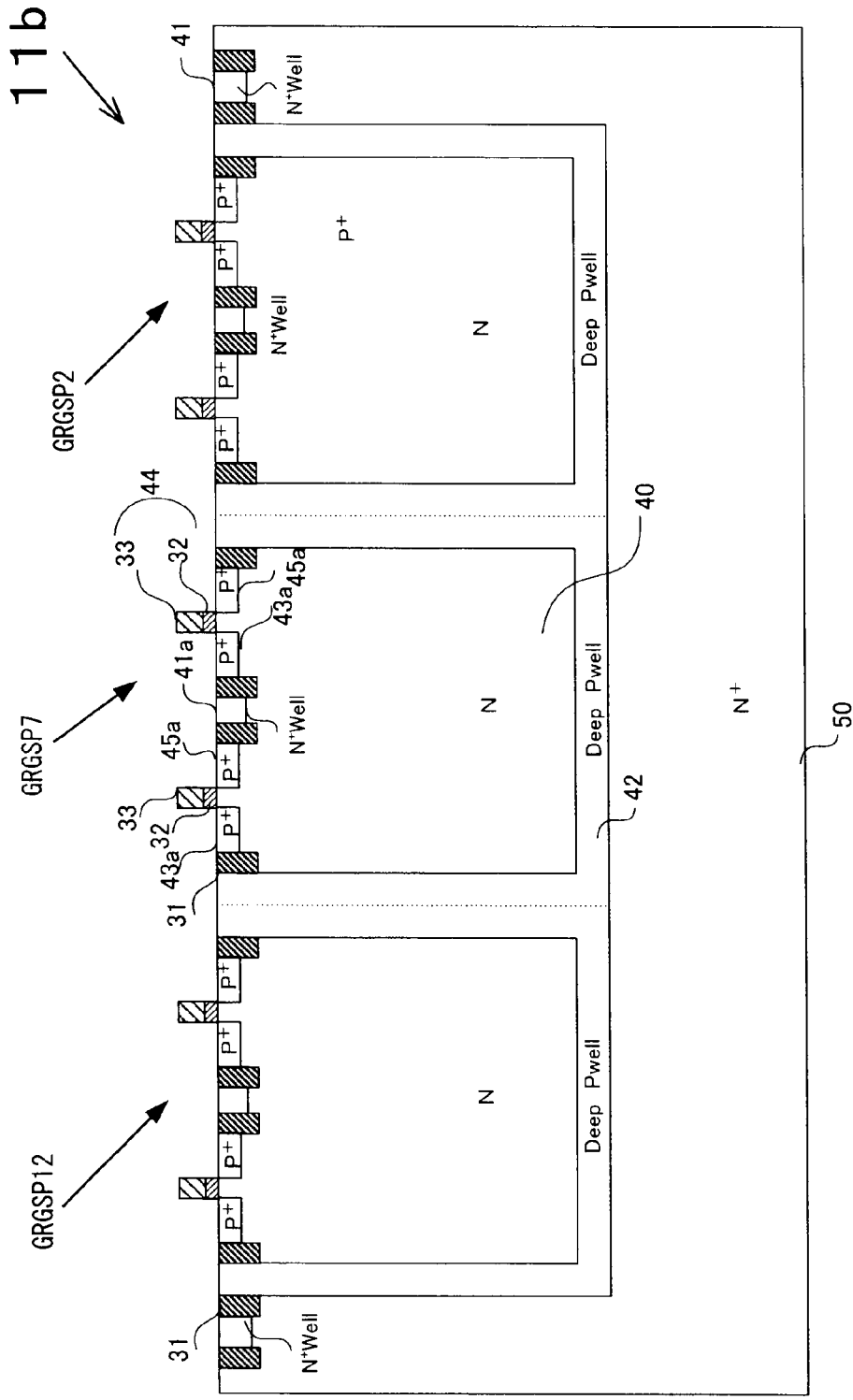

A power amplifier according to a third embodiment will be described with reference to the accompanying drawings. FIG. 12a is a plan view showing the power amplifier and FIG. 12b is a plan view showing a growth ring gate structure. FIG. 13 is a cross-sectional view taken along a C-C line in FIG. 12a. In the embodiment, each of first and second growth ring gate structures has a P-channel MOSFET structure.

As shown in FIG. 12a, a power amplifier 11b is formed by use of the CMOS technique and is provided with growth ring gate structures GRGSP1 to GRGSP15 each having a P-channel MOSFET structure. The power amplifier 11b is mounted on one-chip SoC including an analog circuit unit, a digital circuit unit, and an interface unit, which are formed by use of the CMOS techniques.

An N$^+$ well 41 is formed and arranged in belt-like fashion away from and around the growth ring gate structures GRGSP1 to GRGSP15. The growth ring gate structures GRGSP1 to GRGSP15 are used as output stage transistors (output stage P-channel MOSFETs) of the power amplifier 11b, for example.

Here, illustration and explanation of constituent parts of the power amplifier 11b other than the output stage such as transistors, a matching circuit, wirings, terminals, contacts, via holes will be omitted.

The growth ring gate structures GRGSP7 to GRGSP9 (first structures) are arranged in parallel in a horizontal direction at a central portion in the drawing. The growth ring gate structures GRGSP7 to GRGSP9 collectively function as an active portion 12b and perform the power amplification operation.

The growth ring gate structures GRGSP1 to GRGSP6 and GRGSP10 to GRGSP15 (second structures) are arranged adjacent around the growth ring gate structures GRGSP7 to GRGSP9 in a surrounding manner. The growth ring gate structures GRGSP1 to GRGSP6 and GRGSP10 to GRGSP15 collectively function as an isolation portion 13b. When the growth ring gate structures GRGSP7 to GRGSP9 perform the power amplification operation, the growth ring gate structures GRGSP1 to GRGSP6 and GRGSP10 to GRGSP15 are depleted to constitute a depletion region, thereby isolating the growth ring gate structures GRGSP7 to GRGSP9 from surrounding portions.

As shown in FIG. 2b, the growth ring gate structures GRGSP1 to GRGSP15 are each formed of the growth ring gate structure GRGSP and have the same square shape.

The growth ring gate structure GRGSP includes an N$^+$ well 41a (a body contact), a drain 46, a gate 44, a source 43, and a deep P-well 42, in such a manner that the N$^+$ well 41a is located on the inner side and the deep P-well 42 is located on the outer side.

To be more precise, the N$^+$ well 41a (the body contact) having a square shape is disposed at a central portion. The drain 46 is adjacently disposed outside the N$^+$ well 41a (the body contact) in belt-like fashion. The gate 44 is adjacently disposed outside the drain 46 in belt-like fashion. The source 43 is adjacently disposed outside the gate 44 in belt-like fashion. The deep P-well 42 is adjacently disposed outside the source 43 in belt-like fashion.

As shown in FIG. 13, the growth ring gate structures GRGSP1 to GRGSP15 are bounded by N$^+$ layer 50 (a first semiconductor layer). The N$^+$ well 41 is adjacently disposed around the growth ring gate structures GRGSP1 to GRGSP15. Shallow trench isolations (STI) 31 are provided on both sides of the N$^+$ well 41.

The deep P-well 42 is provided on side surfaces and a bottom surface of each of the growth ring gate structures GRGSP (the growth ring gate structures GRGSP2, GRGSP7, and GRGSP12 are representatively shown herein), whereby the growth ring gate structure GRGSP is isolated from the N$^+$ layer 50. An N-type body 40 is provided on the deep P-well 42. The shallow trench isolations (STI) 31, an P$^+$ layer 43a serving as the source, a P$^+$ layer 45a serving as the drain, and the N$^+$ well 41a (the body contact) are provided on a surface portion of the body 40.

In each of the growth ring gate structures GRGSP2, GRGSP7, and GRGSP12, the shallow trench isolation (STI) 31 is provided between the deep P-well 42 and the P$^+$ layer 43a. The gate 44 including the gate insulating film 32 and the gate electrode 33 is provided on the body 40 between the P$^+$ layer 43a and the P$^+$ layer 45a so as to overlap with the P$^+$ layer 43a and the P$^+$ layer 45a. The shallow trench isolation (STI) 31 is provided between the P$^+$ layer 45a and the N$^+$ well 41a (the body contact).

In the embodiment, only each of the growth ring gate structures GRGSP is changed from the N-channel MOSFET to the P-channel MOSFET. Accordingly, illustration and description of the power amplification operation using the growth ring gate structures GRGSP7 to GRGSP9 and formation of the depletion region by depleting the growth ring gate structures GRGSP1 to GRGSP6 and GRGSP10 to GRGSP15 will be omitted.

As described above, the power amplifier of the embodiment includes the growth ring gate structures GRGSP7 to GRGSP9 that have the P-channel MOSFET structure and perform the power amplification operation, and the growth ring gate structure GRGSP1 to GRGSP6 and GRGSP10 to GRGSP15 that have the P-channel MOSFET structure, are adjacently arranged around the growth ring gate structures GRGSP7 to GRGSP9 in a surrounding manner, and constitute the depletion region at the time of power amplification.

Accordingly, it is possible to drastically suppress variation in an RF substrate current attributable to AC hot carriers generated in the power amplifier 11b by use of the depleted growth ring gate structures GRGSP1 to GRGSP6 and GRGSP10 to GRGSP15. As a consequence, the power amplifier 11b can be stably operated. Meanwhile, it is possible to drastically suppress an RF substrate leakage current to the analog circuit unit 1 excluding the power amplifier 11b, the digital circuit unit, the interface unit, and the like, and thereby to operate the analog circuit unit excluding the power amplifier 11b, the digital circuit unit, and the interface unit stably.

Figure 14:
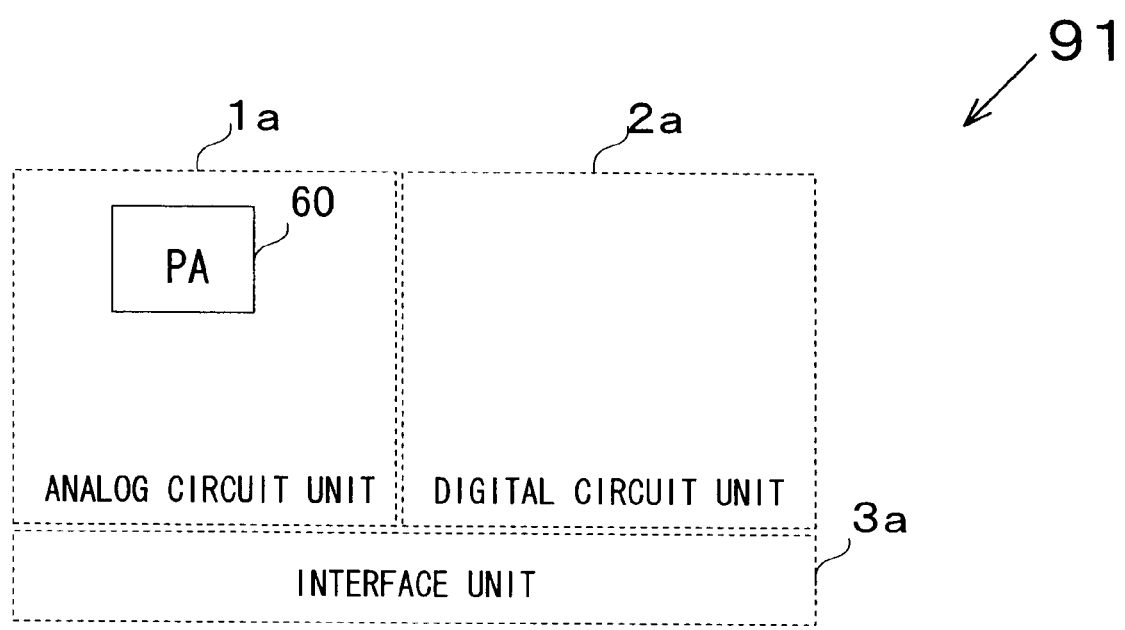
FIG. 14 is a block diagram showing a semiconductor integrated circuit according to a fourth embodiment of the invention.
Figure 15A:
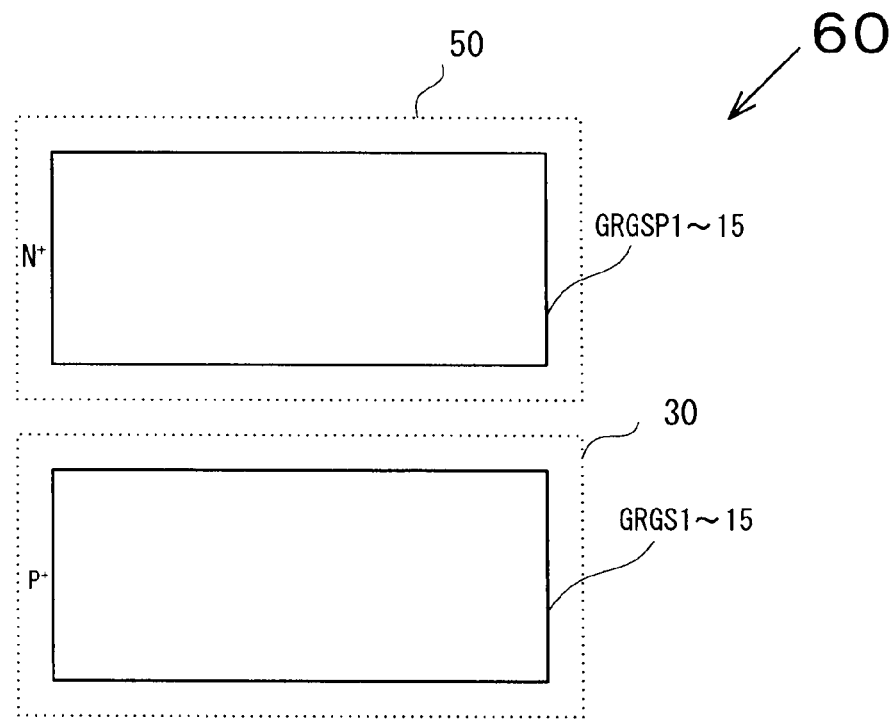
FIGS. 15a and 15b are views showing the power amplifier according to the fourth embodiment.
Figure 15B:
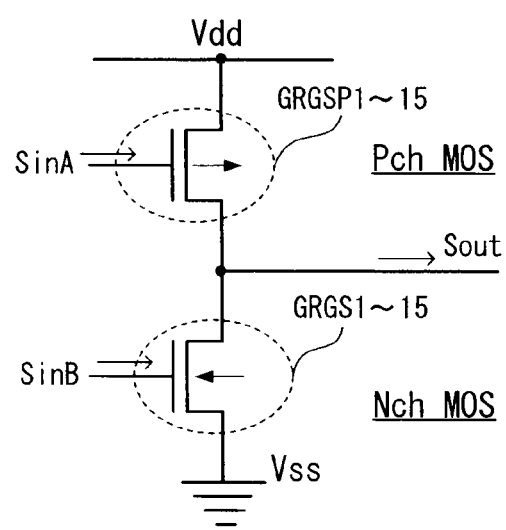

A power amplifier according to a fourth embodiment will be described with reference to the accompanying drawings. FIG. 14 is a block diagram showing a semiconductor integrated circuit. FIG. 15a is a plan view showing the power amplifier and FIG. 15b is a view showing an operation of the power amplifier. In the embodiment, the power amplifier performs a push-pull operation.

Now, the same constituent portions as those in the first embodiment will be designated by the same reference numerals and the relevant explanation will be omitted. Instead, different features from the first embodiment will only be described below.

As shown in FIG. 14, a semiconductor integrated circuit 91 is provided with an analog circuit unit 1a, a digital circuit unit 2a, and an interface unit 3a. The semiconductor integrated circuit 91 is one-chip SoC in which the analog circuit unit 1a, the digital circuit unit 2a, and the interface unit 3a are formed by using a CMOS technique. The analog circuit unit 1a is provided with a power amplifier 60.

As shown in FIG. 15a, the power amplifier 60 is formed by use of the CMOS technique and is provided with growth ring gate structures GRGS1 to GRGS15 each having the N-channel MOSFET structure and growth ring gate structures GRGSP1 to GRGSP15 each having the P-channel MOSFET structure.

The growth ring gate structures GRGS1 to GRGS15 are bounded by a P$^+$ layer 30. The growth ring gate structures GRGSP1 to GRGSP15 are bounded by an N$^+$ layer 50. The P$^+$ layer 30 and the N$^+$ layer 50 are arranged separately from each other.

As shown in FIG. 15b, in the growth ring gate structures GRGSP1 to GRGSP15, a higher voltage source VDD is supplied to the sources, an input signal SinA is inputted to the gates, and an output signal Sout is outputted from the drain side when the input signal SinA is in an enable state (at a low level). The growth ring gate structures GRGSP1 to GRGSP15 are operated as high side output stage P-channel MOSFETs.

In the growth ring gate structures GRGS1 to GRGS15, the drains are connected to the drains of the growth ring gate structures GRGSP1 to GRGSP15, an input signal SinB is inputted to the gates, the sources are connected to the lower voltage source (the ground potential) Vss, and the output signal Sout is outputted from the drain side when the input signal SinB is in an enable state (at a high level). The growth ring gate structures GRGS1 to GRGS15 are operated as low side output stage N-channel MOSFETs.

The growth ring gate structures GRGSP1 to GRGSP15 and the growth ring gate structures GRGS1 to GRGS15 perform the push-pull operation. Specifically, the growth ring gate structures GRGS1 to GRGS15 are turned off when the growth ring gate structures GRGSP1 to GRGSP15 are turned on. Meanwhile, the growth ring gate structures GRGSP1 to GRGSP15 are turned off when the growth ring gate structures GRGS1 to GRGS15 are turned on. It is possible to improve efficiency of the power amplifier by adopting the push-pull structure to the output stage.

As described above, the power amplifier of the embodiment is provided with the growth ring gate structures GRGSP1 to GRGSP15 on the high side and the growth ring gate structures GRGS1 to GRGS15 on the low side. The growth ring gate structures GRGSP1 to GRGSP15 are operated as the output stage P-channel MOSFETs. The growth ring gate structures GRGS1 to GRGS15 are operated as the output stage N-channel MOSFETs.

Accordingly, it is possible to drastically suppress variation in an RF substrate current attributable to AC hot carriers generated in the power amplifier 60 by use of the depleted growth ring gate structures GRGS1 to GRGS6 and GRGS10 to GRGS15 and the depleted growth ring gate structures GRGSP1 to GRGSP6 and GRGSP10 to GRGSP15. As a consequence, the power amplifier 60 can be stably operated. Meanwhile, it is possible to drastically suppress an RF substrate leakage current to the analog circuit unit la excluding the power amplifier 60, the digital circuit unit 2a, the interface unit 3a, and the like, and thereby to operate the analog circuit unit 1a excluding the power amplifier 60, the digital circuit unit 2a, and the interface unit 3a stably. Further, since it is not necessary to provide the metal lines or wide deep N-well layers to deal with the AC hot carriers, it is possible to reduce the chip size of the semiconductor integrated circuit 91. In addition, since the power amplifier 60 performs the push-pull operation, it is possible to improve power efficiency as compared to the first embodiment.

It is to be understood that the invention is not limited only to the above-described embodiments and various modifications are possible without departing from the scope of the invention.

In the embodiment, the growth ring gate structures included in the power amplifier are configured to be similar to the MOSFET included in a CMOS circuit. Instead, it is possible to employ a power MOSFET such as a LDMOS, which can increase withstand voltage as compared to the MOSFET included in the CMOS circuit.

Although the growth ring gate structures are used for the output stage transistors of the power amplifier, the invention is not limited only to this configuration. When the power amplifier includes multiple stage transistors, for example, the growth ring gate structures are also applicable to the transistors other than the output stage.

While certain embodiments have been described, these embodiments have been presented by way of example only, and are not intend to limit the scope of the inventions. Indeed, the novel embodiments described herein may be embodied in a variety of the other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A power amplifier, comprising:
   at least one first structure being bounded by a semiconductor layer of a first conductivity type, and the first structure including a first body contact of the first conductivity type, a first drain, a first gate, a first source, and a first deep well of a second conductivity type, and the first structure being arranged in a polygonal shape having n corners or in an annular shape in such a manner that the first body contact is located on the inner side and the first deep well is located on the outer side, the first drain, the first gate and the first source being located between the first body contact and the first deep well, n being an integer equal to or greater than 3; and
   a plurality of second structures being bounded by of the semiconductor layer and being arranged adjacently around the first structure in a surrounding manner, each of the plurality of second structures including a second body contact of the first conductivity type, a second drain, a second gate, a second source, and a second deep well of the second conductivity type, and each of the plurality of second structures being arranged in the polygonal shape having n corners or in the annular shape in such a manner that the second body contact is located on the inner side and the second deep well is located on the outer side, the second drain, the second gate and the second source being located between the second body contact and the second deep well, wherein, when the first structure performs a power amplification operation, the plurality of second structures are depleted by applying a reverse bias to the plurality of second structures, and the plurality of depleted second structures isolate the first structure from a surrounding portion.

2. The power amplifier according to claim 1,
wherein the first deep well is provided on side surfaces and a bottom surface of a first body of the first structure and isolates the first body from the semiconductor layer, and
the second deep well is provided on side surfaces and a bottom surface of a second body of each of the plurality of second structures and isolates the second body from the semiconductor layer.

3. The power amplifier according to claim 2,
wherein the semiconductor layer has a higher impurity concentration than impurity concentrations of the first and second bodies.

4. The power amplifier according to claim 1,
wherein the first and second deep wells are deep N-wells, a voltage lower than a breakdown voltage is applied to the second deep well, and the second body contact is set to ground potential when each of the plurality of second structures is depleted.

5. The power amplifier according to claim 4,
wherein the first and second structures are N-channel MOS transistors.

6. The power amplifier according to claim 1,
wherein the first and second deep wells are deep N-wells, a voltage lower than a breakdown voltage is applied to the second drain and the second source, and the second body contact is set to ground potential when each of the plurality of second structures is depleted.

7. The power amplifier according to claim 1,
wherein the power amplifier and a CMOS circuit are provided on a single semiconductor integrated circuit chip, and
the power amplifier and the CMOS circuit are isolated from each other by the semiconductor layer.

8. A power amplifier, comprising:
at least one first structure being bounded by a first semiconductor layer of a first conductivity type, and the first structure including a first body contact of the first conductivity type, a first drain, a first gate, a first source, and a first deep well of a second conductivity type, and the first structure being arranged in a polygonal shape having n corners or in an annular shape in such a manner that the first body contact is located on the inner side and the first deep well is located on the outer side, the first drain, the first gate and the first source being located between the first body contact and the first deep well, n being an integer equal to or greater than 3;
a plurality of second structures being bounded by the first semiconductor layer and being arranged adjacently around the first structure in a surrounding manner, each of the plurality of second structures including a second body contact of the first conductivity type, a second drain, a second gate, a second source, and a second deep well of the second conductivity type, and each of the plurality of second structures being arranged in the polygonal shape having n corners or in the annular shape in such a manner that the second body contact is located on the inner side and the second deep well is located on the outer side, the second drain, the second gate and the second source being located between the second body contact and the second deep well;
at least one third structure being bounded by a second semiconductor layer of the second conductivity type, and the third structure including a third body contact of the second conductivity type, a third drain, a third gate, a third source, and a third deep well of the first conductivity type, the third structure being arranged in the polygonal shape having n corners or in the annular shape in such a manner that the third body contact is located on the inner side and the third deep well is located on the outer side, the third drain, the third gate and the third source being located between the third body contact and the third deep well, the third drain being connected to the first drain; and
a plurality of fourth structures being bounded by the second semiconductor layer and being arranged adjacently around the third structure in a surrounding manner, each of the plurality of fourth structures including a fourth body contact of the second conductivity type, a fourth drain, a fourth gate, a fourth source, and a fourth deep well of the first conductivity type, and each of the plurality of fourth structures being arranged in the polygonal shape having n corners or in the annular shape in such a manner that the fourth body contact is located on the inner side and the fourth deep well is located on the outer side, the fourth drain, the fourth gate and the fourth source being located between the fourth body contact and the fourth deep well,
wherein the first structure and the third structure perform a push-pull power amplification operation,
when the first structure is operated, the plurality of second structures are depleted by applying a reverse bias to the plurality of second structures, and the plurality of depleted second structures isolate the first structure from a surrounding portion, and
when the third structure is operated, the plurality of fourth structures are depleted by applying a reverse bias to the plurality of fourth structures, and the plurality of depleted fourth structures isolate the third structure from a surrounding portion.

9. The power amplifier according to claim 8,
wherein the first deep well is provided on side surfaces and a bottom surface of a first body of the first structure and isolates the first body from the first semiconductor layer,
the second deep well is provided on side surfaces and a bottom surface of a second body of each of the plurality of second structures and isolates the second body from the first semiconductor layer,
the third deep well is provided on side surfaces and a bottom surface of a third body of the third structure and isolates the third body from the second semiconductor layer, and
the fourth deep well is provided on side surfaces and a bottom surface of a fourth body of each of the plurality of fourth structures and isolates the fourth body from the second semiconductor layer.

10. The power amplifier according to claim 8,
wherein the first and second deep wells are deep P-wells, and
the third and fourth deep wells are deep N-wells.

11. The power amplifier according to claim 10,
wherein the first structure and the plurality of second structures are P-channel MOS transistors, and the third structure and the plurality of fourth structures are N-channel MOS transistors.

12. The power amplifier according to claim 11,
wherein an output signal is outputted from the first drain side of the first structure.

* * * * *